United States Patent
Mueller

(10) Patent No.: US 6,973,629 B2
(45) Date of Patent: Dec. 6, 2005

(54) CIRCUIT ARRANGEMENT

(75) Inventor: Detlef Mueller, Barsbuettel (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 406 days.

(21) Appl. No.: 10/169,925

(22) PCT Filed: Nov. 14, 2001

(86) PCT No.: PCT/EP01/13267

§ 371 (c)(1),
(2), (4) Date: Jul. 10, 2002

(87) PCT Pub. No.: WO02/41323

PCT Pub. Date: May 23, 2002

(65) Prior Publication Data

US 2003/0172359 A1 Sep. 11, 2003

(30) Foreign Application Priority Data

Nov. 15, 2000 (EP) .................................. 10056950

(51) Int. Cl.[7] .......................................... G06F 17/50
(52) U.S. Cl. .......................................... 716/1; 716/17
(58) Field of Search ................................ 716/1, 17, 16

(56) References Cited

U.S. PATENT DOCUMENTS

| | | | | |
|---|---|---|---|---|
| 4,736,195 A | * | 4/1988 | McMurtry et al. | 340/568.3 |
| 4,833,650 A | | 5/1989 | Hirayama et al. | 365/225.7 |
| 4,858,233 A | * | 8/1989 | Dyson et al. | 714/3 |
| 4,985,822 A | * | 1/1991 | Yamashita et al. | 700/13 |
| 5,821,770 A | | 10/1998 | Rees | 326/38 |
| 5,889,679 A | | 3/1999 | Henry et al. | 364/488 |
| 5,926,084 A | * | 7/1999 | Frochte | 337/231 |
| 2003/0112033 A1 | * | 6/2003 | Sams | 326/56 |

FOREIGN PATENT DOCUMENTS

EP 0591870 A2 4/1994 ........... G11C 17/18

* cited by examiner

*Primary Examiner*—Sun James Lin
(74) *Attorney, Agent, or Firm*—Adam L. Stroud

(57) ABSTRACT

Fuses that selectively disable functional blocks of a circuit are arranged in a multistage structure, wherein if any fuse element in the multistage structure permanently switches off a part of the circuit, no other fuse element in the multistage structure can affect the switching off of the part. Master fuses are provided to selectively disable corresponding stages of the multistage structure. Preferably, the master fuses are arranged in a hierarchy, so that a master fuse at a higher level of the hierarchy selectively disables all of the stages at lower levels of the hierarchy.

20 Claims, 1 Drawing Sheet

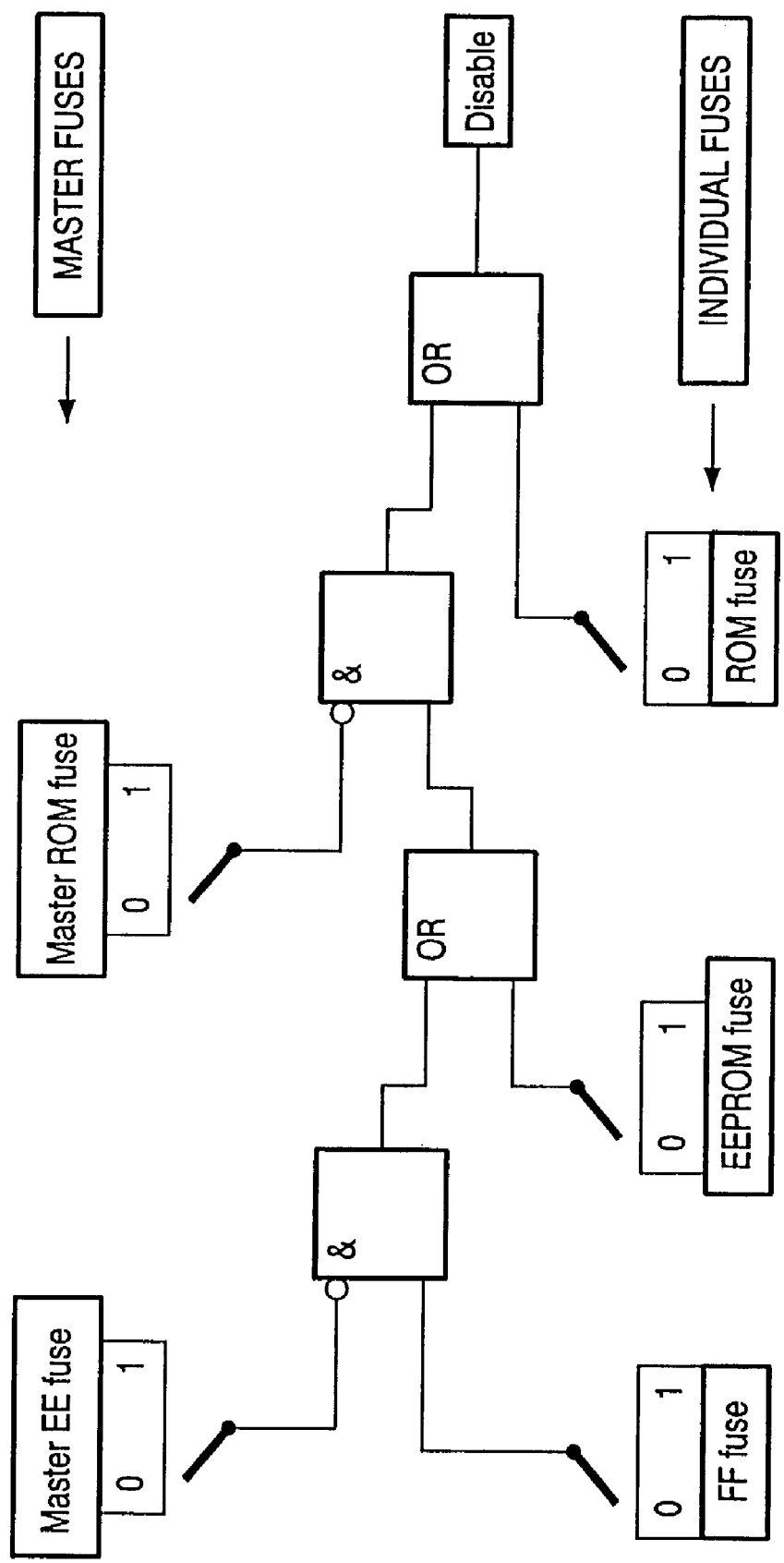

CIRCUIT ARRANGEMENT

The invention relates to a circuit arrangement. The invention particularly relates to a circuit arrangement for electronically processing and/or storing digital signals.

In order that a basis is obtained in the design and manufacture of a circuit arrangement for electronically processing and/or storing digital signals with single circuitry for a possibly large number of variants to be derived therefrom and constituting a so-called product family, and in order to be able to manufacture these variants with a minimal number of components and thus within a short period of time, a so-called maximal configuration of this new product family is defined as a single circuit configuration of the above-mentioned kind, from which different special products as members or sub-groups of this product family can be derived as so-called derivatives by means of programmable switching devices (referred to as "fuses"), in that components or groups of components of the maximal configuration which are not required for the special product are permanently switched to an inactive state. In this case, both a versatile, easy and multi-modifiable prototype construction, as well as a possibly simple and reliable production of the corresponding derivatives is to be aimed at.

It is an object of the invention to provide a measure allowing both a versatile and modifiable prototype construction and a possibly simple and reliable production of the corresponding derivatives.

According to the invention, this object is solved by a circuit arrangement, particularly for electronically processing and/or storing digital signals, the circuit arrangement comprising at least one programmable switching device (referred to as "fuse") for permanently switching off predetermined parts of the circuit arrangement, at least one of the fuses having a multistage structure.

A fundamental principle of the invention is to have a multistage construction for the fuses required for configuring said derivatives. The result of combining a plurality of such fuses in consecutive stages is obtained from the type of the respective combination of these fuses. The most flexible fuse has the lowest priority. Its effect may be overruled by the nearest flexible fuse.

It is to be noted in this respect that fuses are used for locking parts of a circuit so as to secure given functions in smart card controllers. A distinction is made between functions which are required from time to time, for example, in the manufacturing control stage, and functions which are to be switched off permanently, for example, for configuring a derivative from a product family. Such fuses are either "NV fuses" which are formed, for example, with EEPROM storage devices, or "hard wired fuses" which are formed by special wiring of the circuit arrangement (preferably on the semiconductor crystal of an integrated circuit) or by means of special ROM memory cells.

The NV fuses have the advantage of a high flexibility in the configuration and a fast prototype construction of different derivatives. A drawback is the proportionally high number of components which is required for the configuration in the manufacturing control stage during mass production.

The hard wired fuses have the advantage that they do not require a high number of configuration components in mass production. Their drawback is, however, that a separate mask is required for each derivative. Consequently, the hard wired fuses are very inflexible so that a fast prototype construction of different derivatives is not possible.

An embodiment of the invention is shown in the sole FIGURE of the drawing and will be elucidated hereinafter.

The FIGURE illustrates an example of a three-stage fuse consisting of a programmable flip-flop cell, an EEPROM cell and a ROM cell.

The most flexible variant of the configuration is the programmable flip-flop cell ("flip-flop fuse" or "FF fuse"). The state of the FF fuse decides about switching on or switching off the function to be locked, in so far as the EEPROM cell ("EEPROM fuse") and the ROM cell ("ROM fuse") release this function. A configuration can thereby be manufactured by way of user software, which represents this FF fuse as the most flexible of all fuse variants. This variant may be used, for example, to enable a user or operator of a circuit arrangement according to the invention to find the optimal configuration of a product family derivative desired by this user, which he may subsequently construct as a new design.

The EEPROM fuse decides about switching on or switching off the function to be combined or to be locked when the ROM fuse releases this function. The switching state of the FF fuse is irrelevant when the EEPROM fuse is activated. In, for example, the final measurements by means of test programs within the scope of the manufacturing control stage of a given derivative, the manufacturer can produce a given derivative by way of specially programming the EEPROM fuse or a sequence of EEPROM fuses, or all of the EEPROM fuses used in this way, which can no longer be changed by the end customer. However, the manufacturer is still capable of generating different derivatives by means of a test program from one and the same semiconductor product as is obtained in the mechanical and chemical manufacturing stages for semiconductor circuits. A higher number of components as well as careful attention during testing is required for generating the correct derivative, which might be a drawback.

When a customer for a given derivative orders his own ROM code, i.e. a special programming of the ROM fuses adapted to the desired derivative, the corresponding ROM fuses are programmed together with the ROM code. The ROM fuses have priority over the EEPROM fuses and the FF fuses. The derivative is thereby defined unambiguously. The functions of the circuit arrangement switched off per ROM fuse can no longer be activated.

When the circuit arrangement according to the invention comprises an additional, programmable switching device having priority (here referred to as "master fuse"), which is built up exactly as the individual cells of these fuses up to the last plane of the above-described sequence of fuses, the derivative can also be reset (here also referred to as "frozen") to a defined, unchangeable switching and operating state, also for the fuses that are still open. In the example described hereinbefore, this means that the master fuse consists of a part comprising an EEPROM fuse and a part comprising a ROM fuse. When the EEPROM fuse of the master fuse is set, FF fuses can no longer be programmed, even when the individual FF fuses would admit this. When the ROM fuse of the master fuse is set, "open" EEPROM fuses can no longer be programmed. It is thereby ensured that the configuration of the individual derivatives can be "frozen" at any plane.

The minor drawback of a slightly higher surface area requirement due to additional logic components in the circuit arrangement according to the invention is offset by the unambiguously predominant advantages of the fuses, namely the high flexibility in the circuit configuration and the operation, and of the hard wired fuses which do not involve a great configuration effort. These advantages are combined with a set of masks in a circuit arrangement according to the invention.

What is claimed is:

1. A circuit arrangement, particularly for electronically processing and/or storing digital signals, the circuit arrangement comprising at least one programmable switching device (referred to as "fuse") for permanently switching off a predetermined part of the circuit arrangement, at least one of the fuses having a multistage structure wherein if any fuse element in the multistage structure permanently switches off the predetermined part of the circuit arrangement, no other fuse element in the multistage structure can affect the switching off of the predetermined part of the circuit arrangement.

2. The circuit arrangement of claim 1, further including one or more master fuses that are configured to selectively disable a corresponding stage of the multistage structure.

3. The circuit arrangement of claim 2, wherein stages of the multistage structure are arranged in a hierarchy, such that a master fuse at a higher level of the hierarchy is configured to selectively disable all of the stages at lower levels of the hierarchy.

4. The circuit arrangement of claim 1, wherein at least one stage of the multistage structure includes a fuse element whose state is set during manufacture and cannot be changed.

5. The circuit arrangement of claim 1, wherein the multistage structure includes at least two of the following:
    a ROM fuse element,
    an EEPROM fuse element, and
    a user controllable fuse element.

6. The circuit arrangement of claim 5, further including one or more master fuses that are configured to selectively disable a corresponding stage of the multistage structure.

7. The circuit arrangement of claim 6, wherein stages of the multistage structure are arranged in a hierarchy, such that a master fuse at a higher level of the hierarchy is configured to selectively disable all of the stages at lower levels of the hierarchy.

8. A microprocessor, characterized by a circuit arrangement, particularly for electronically processing and/or storing digital signals, the circuit arrangement comprising at least one programmable switching device (referred to as "fuse") for permanently switching off a predetermined part of the circuit arrangement, at least one of the fuses having a multistage structure wherein if any fuse element in the multistage structure permanently switches off the predetermined part of the circuit arrangement, no other fuse element in the multistage structure can affect the switching off of the predetermined part of the circuit arrangement.

9. The microprocessor of claim 8, further including one or more master fuses that are configured to selectively disable a corresponding stage of the multistage structure.

10. The microprocessor of claim 9, wherein stages of the multistage structure are arranged in a hierarchy, such that a master fuse at a higher level of the hierarchy is configured to selectively disable all of the stages at lower levels of the hierarchy.

11. The microprocessor of claim 8, wherein at least one stage of the multistage structure includes a fuse element whose state is set during manufacture and cannot be changed.

12. The microprocessor of claim 8, wherein the multistage structure includes at least the following:
    a ROM fuse element,
    an EEPROM fuse element, and
    a user controllable fuse element.

13. The microprocessor of claim 12, further including one or more master fuses that are configured to selectively disable a corresponding stage of the multistage structure.

14. The microprocessor of claim 13, wherein stages of the multistage structure are arranged in a hierarchy, such that a master fuse at a higher level of the hierarchy is configured to selectively disable all of the stages at lower levels of the hierarchy.

15. A microprocessor for use in a chip card (referred to as "smart card controller"), characterized by a circuit arrangement, particularly for electronically processing and/or storing digital signals, the circuit arrangement comprising at least one programmable switching device (referred to as "fuse") for permanently switching off a predetermined part of the circuit arrangement, at least one of the fuses having a multistage structure wherein if any fuse element in the multistage structure permanently switches off the predetermined part of the circuit arrangement, no other fuse element in the multistage structure can affect the switching off of the predetermined part of the circuit arrangement.

16. The microprocessor of claim 15, further including one or more master fuses that are configured to selectively disable a corresponding stage of the multistage structure.

17. The microprocessor of claim 16, wherein stages of the multistage structure are arranged in a hierarchy, such that a master fuse at a higher level of the hierarchy is configured to selectively disable all of the stages at lower levels of the hierarchy.

18. The microprocessor of claim 15, wherein the multistage structure includes at least two of the following:
    a ROM fuse element,
    an EEPROM fuse element, and
    a user controllable fuse element.

19. The microprocessor of claim 18, further including one or more master fuses that are configured to selectively disable a corresponding stage of the multistage structure.

20. The microprocessor of claim 19, wherein stages of the multistage structure are arranged in a hierarchy, such that a master fuse at a higher level of the hierarchy is configured to selectively disable all of the stages at lower levels of the hierarchy.

* * * * *